United States Patent
Chen et al.

(10) Patent No.: US 6,303,461 B1
(45) Date of Patent: Oct. 16, 2001

(54) METHOD FOR FABRICATING A SHALLOW TRENCH ISOLATION STRUCTURE

(75) Inventors: Hsueh-Chung Chen, Taipei Hsien; Chien-Hung Chen, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/221,203

(22) Filed: Dec. 23, 1998

(51) Int. Cl.$^7$ ..................................................... H01L 21/76
(52) U.S. Cl. ............................................. 438/404; 438/424
(58) Field of Search ..................................... 438/404, 424

(56) References Cited

U.S. PATENT DOCUMENTS

| | | | |
|---|---|---|---|
| 5,786,262 | * | 7/1998 | Jang et al. . |
| 5,811,345 | * | 9/1998 | Yu et al. . |
| 5,925,575 | * | 7/1999 | Tao et al. . |
| 5,994,201 | * | 11/1999 | Lee . |
| 6,043,133 | * | 3/2000 | Jang et al. . |
| 6,117,748 | * | 9/2000 | Lou et al. . |

OTHER PUBLICATIONS

Wolf et al., Silicon Processing for the VLSI Era, vol. 1, 1986, Lattice Press, pp. 177–178.*

* cited by examiner

Primary Examiner—John F. Niebling
Assistant Examiner—Josetta I. Jones

(57) ABSTRACT

A method for fabricating a shallow trench isolation (STI) structure is provided. The method contain sequentially forming a pad oxide layer, a hard layer, and a polysilicon layer on the substrate, all of which are patterned to form a trench in the substrate to define several active areas. The hard layer usually includes silicon nitride. An insulating layer is formed over the substrate so that the trench is also filled. A CMP process is performed to polish the insulating layer. The CMP process is continuously performed until the hard layer is completely exposed. The hard layer and the pad oxide layer are sequentially removed to form the STI structure.

12 Claims, 3 Drawing Sheets

US 6,303,461 B1

METHOD FOR FABRICATING A SHALLOW TRENCH ISOLATION STRUCTURE

BACKGROUND OF THE INVENTION

1. Field of the Invention

This invention relates to semiconductor fabrication, and more particularly to a method for fabricating a shallow trench isolation (STI) structure with a prevention of dishing phenomenon.

2. Description of Related Art

An isolation structure is used to prevent carriers from drifting between two adjacent devices, such as metal-oxide semiconductor (MOS) transistors, through a semiconductor substrate, on which the MOS transistors are formed. So, a charge leakage occurring on the MOS transistors is also avoided. As device integration continuously increases and line width continuously decreases, the fabrication process has achieved to a fabrication level of 0.25 microns or less. At this fabrication level, using STI structure for the isolation purpose becomes a necessary strategy. A STI structure, typically, is formed by patterning a semiconductor substrate by photolithography and anisotropic etching to form a shallow trench in the substrate, and filling the trench with insulating material.

When fabrication level reaches to about 0.25 microns or less, a chemical mechanical polishing (CMP) process is also widely used to globally planarize or polish the structures formed over the substrate. The STI structure conventionally needs the CMP process to polish undesired insulating material deposited on the substrate. However, the CMP process also causes a dishing issue.

FIG. 1A and FIG. 1B are cross-sectional views of a portion of a substrate, schematically illustrating a conventional fabrication process to form a STI structure. In FIG. 1A, a pad oxide layer 12 is formed on a semiconductor substrate 10. A silicon nitride layer 14 is formed on the pad oxide layer 12. Patterning the silicon nitride layer 14, the pad oxide layer 12, and the substrate 10 forms a trench 15a and a trench 15b in the substrate 10, in which the trench 15b is wider than the trench 15a. An oxide layer 16 is formed over the substrate 10 so that the trenches 15a, 15b are also filled by oxide. The top surface of the oxide layer 16 is not planar due to a concave structure of the trenches 15a, 15b. Several silicon-nitride flat regions 14a, 14b between the trenches 15a, 15b are also simultaneously formed after patterning. The silicon-nitride flat region 14b is wider than the silicon-nitride flat region 14a. The oxide layer 16 is formed by chemical vapor deposition (CVD).

In FIG. 1B, after a densification process is performed on the oxide layer 16, a CMP process, using the silicon nitride layer 14 as a stop point, is performed to planarize the oxide layer 16. A remaining portion of the oxide layer 16 becomes an oxide layer 16a.

While the CMP process is performed, the structure surface of the substrate 10 is pressed onto a rotating polishing pad to achieve a polishing purpose. Since the oxide layer 16 is not planar, the polishing pad may easily get a deformation at a portion above the wider trench 15b. After the CMP process, several issues are very possibly induced.

First, a dishing phenomenon 18 occurs on the oxide layer 16a filled in the wider trench 15b shown in FIG. 1A, Second, there is a residue of the oxide layer 16a left on the wider silicon-nitride flat region 14b. Third, since the substrate 100 includes the siliconnitride flat regions 14a, 14b and the trenches 15a, 15b, all of which have different dimension, it is difficult to obtain a sufficient uniformity of the oxide layer 16a after the CMP process.

Conventionally, in order to completely remove the residue of the oxide layer 16a on the silicon nitride layer 14, a strategy of over-polishing on the silicon nitride layer 14 is applied. If there is the residue of the oxide layer on the silicon nitride, it causes a difficulty to remove the silicon nitride layer later. However, even though the residue of the oxide layer 16a can be completely removed, the dishing phenomenon of the oxide layer 16a is aggravated due to a faster polishing rate of the oxide layer 16a.

Conventionally, in order to solve the dishing issue, a dummy pattern structure is proposed by a conventional method. FIG. 2 is a cross-sectional view of a portion of a substrate, schematically illustrating a dummy pattern structure. In FIG. 2, the like reference number represents the like object. Also referring to FIG. 1A and FIG. 1B, a dummy pattern structure 20 is formed in the wider trench 15b so that the trench 15b is divided into two trenches 15c. In this manner, the width of the trenches 15c has not much difference to the trench 15a. Since the width of the trench 15a is narrowed into the width of the trenches 15c the dishing phenomenon is reduced. The dummy pattern structure 20 can reduce the dishing phenomenon but the difference dimension of the silicon-nitride flat regions 14a, 14b is still not solved yet. This causes the residue of the oxide layer 16a remaining on the silicon-nitride layer 14 can not be uniformly removed.

SUMMARY OF THE INVENTION

It is therefore an objective of the present invention to provide a method for fabricating a STI structure, in which a dishing phenomenon is effectively avoided.

It is another an objective of the present invention to provide a method for fabricating a STI structure, in which a residue of an oxide layer is avoided.

In accordance with the foregoing and other objectives of the present invention, an improved method for fabricating a STI structure is provided. The improved method includes sequentially forming a pad oxide layer, a hard layer, and a polysilicon layer on the substrate, all of which are patterned to form a wider trench and a narrower trench in the substrate to define several active areas. The hard layer usually includes silicon nitride. An insulating layer is formed over the substrate so that the wider trench and the narrower trench are also filled. A CMP process is performed to polish the insulating layer. Since the polysilicon layer has faster polishing rate than that of the insulating layer, a dishing phenomenon is completely avoided. The CMP process is continuously performed until the hard layer is completely exposed. The hard layer and the pad oxide layer are sequentially removed to form the STI structure.

In accordance with the foregoing and other objectives of the present invention, another improved method, including a reverse patterning process, for fabricating a STI structure is provided. The improved method including sequentially forming a pad oxide layer, a hard layer, and a polysilicon layer on the substrate, all of which are patterned to form a wider trench and a narrower trench in the substrate to define several active areas. The hard layer typically includes silicon nitride. An insulating layer is formed over the substrate so that the wider trench and the narrower trench are also filled. A reverse patterning process is performed to pre-remove the insulating layer. The reverse patterning process includes performing an etching process, using the polysilicon layer as a etching stop point, to remove the insulating layer at a portion above the active areas. This manner can reduce the duration time of a CMP process performed subsequently. The CMP process is performed to polish both the insulating layer and the polysilicon layer. Since the polysilicon layer includes a faster polishing rate than that of the insulating layer, a dishing phenomenon is completely avoided. The CMP process is continuously performed until the hard layer is fully exposed. The hard layer and the pad oxide layer are respectively removed to form the STI structure.

BRIEF DESCRIPTION OF DRAWINGS

The invention can be more fully understood by reading the following detailed description of the preferred embodiments, with reference made to the accompanying drawings as follows.

DETAILED DESCRIPTION OF PREFERRED EMBODIMENTS

In the method for fabricating a shallow trench isolation (STI) structure, the invention uses a polysilicon layer to effectively avoid a dishing phenomenon and a residue of insulating material on the STI structure. Two preferred embodiments are, for example, described here.

EXAMPLE 1

Figure 1A:
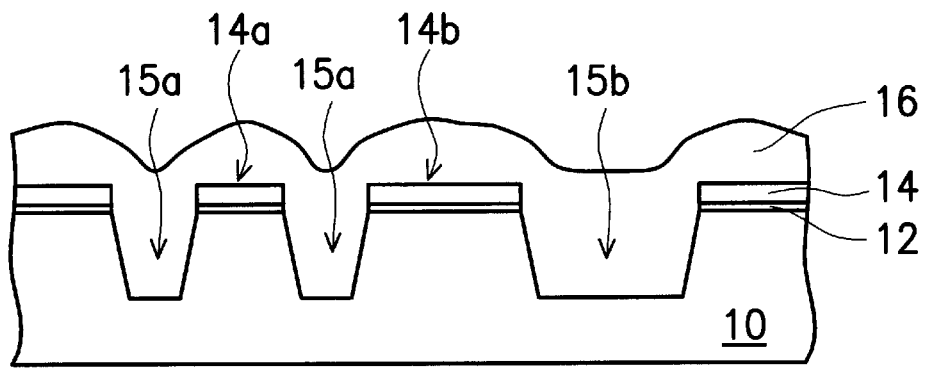
FIG. 1A and FIG. 1B are cross-sectional views of a portion of a substrate, schematically illustrating a conventional fabrication process to form a STI structure.
Figure 1B:
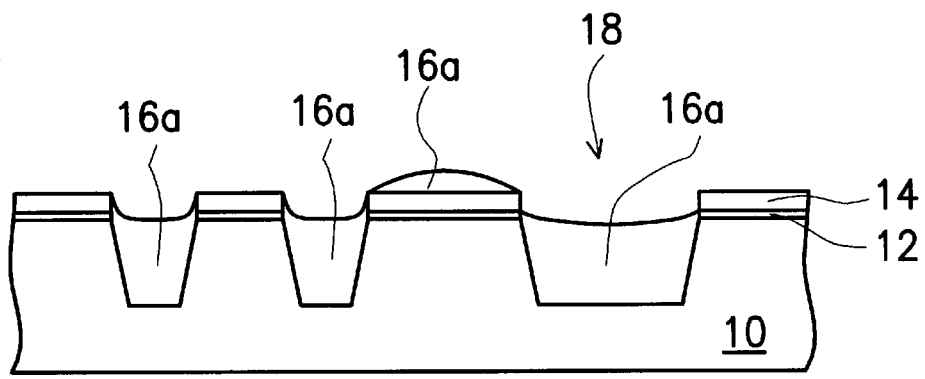
Figure 2:
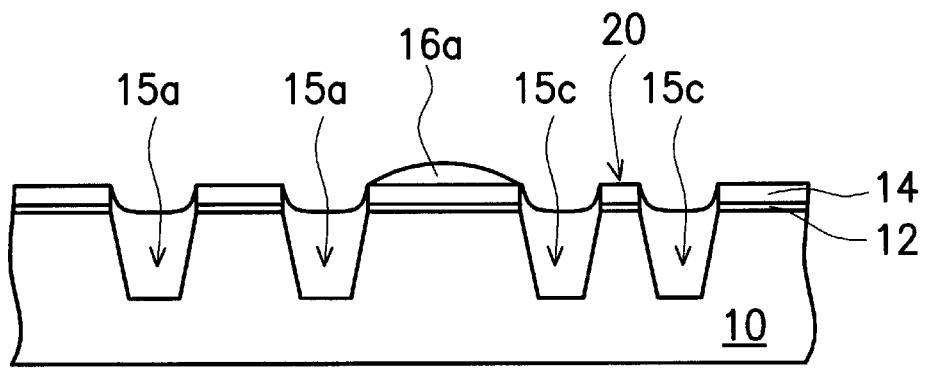
FIG. 2 is a cross-sectional view of a portion of a substrate, schematically illustrating a conventional dummy pattern structure.
Figure 3A:
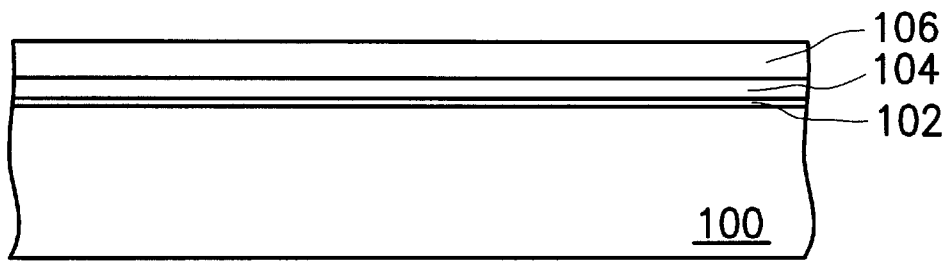
FIGS. 3A–3C are cross-sectional views of a portion of a substrate, schematically illustrating a fabrication process to form a STI structure, according to a first preferred embodiment of the invention.
Figure 3B:
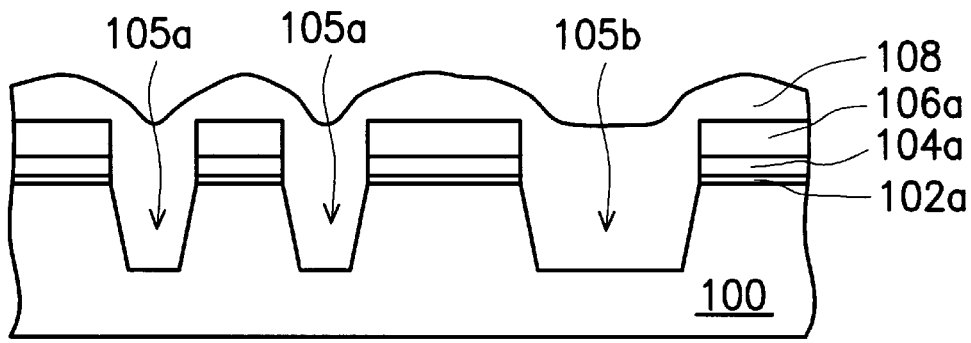
Figure 3C:
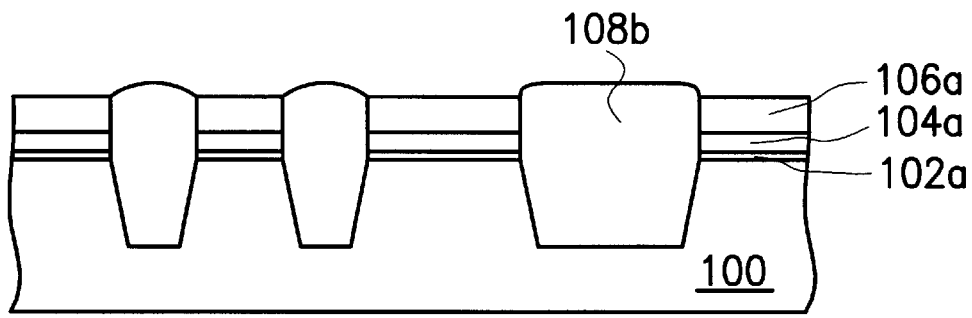

FIGS. 3A–3C are cross-sectional views of a portion of a substrate, schematically illustrating a fabrication process to form a STI structure, according to a first preferred embodiment of the invention. In FIG. 3A, a pad oxide layer 102 is formed on a semiconductor substrate 100 by, for example, thermal oxidation. A mask layer 104 including, for example, silicon nitride is formed on the pad oxide layer 102 by, for example, chemical vapor deposition (CVD). The mask layer 104 preferably includes a thickness of about 500 Å–2000 Å. A polysilicon layer 106 is formed on the mask layer 104 with a thickness of about 500 Å–2000 Å. The polysilicon layer 106 is one of characteristics of the invention. The polysilicon layer 106 allows the conventional dishing issue and a residue issue of an insulating material on an STI structure to be avoided.

In FIG. 3B, a patterned photoresist layer (not shown) is formed on the polysilicon layer 106 so as to form several trenches, such as trenches 105a, 105b, in the substrate 100 by, for example, anisotropic etching. Several regions between the trenches 105a, 105b are called active regions. The dimension of each active region may different to each other. The width of the trench 150a is narrower than the width of the trench 105b. The pad oxide layer 102, the mask layer 104, and the polysilicon layer 106 of FIG. 3A respectively become a pad oxide layer 104a, a mask layer 104a, and a polysilicon layer 106a. An insulating layer 108 is formed over the substrate 100 so that the trenches 105a, 105n are also filled. The insulating layer 108 includes, for example, silicon oxide. Before the insulating layer 108 is formed, a liner oxide layer (not shown) is preferably formed on the trench inner surface by thermal oxidation.

In FIG. 3B and FIG. 3C, a densification process is performed to densify the insulating layer 108. A planarization process is performed to planarize the insulating layer 108 and the polysilicon layer 106a. The planarization process includes, for example, a CMP process. Since the polysilicon layer 106a has a polishing rate about 3–4 times faster than the insulating layer 108, once the polysilicon layer 106a is exposed, it is polished by the CMP process with a faster rate. In this manner, there is no dishing phenomenon occurring on the insulating layer 108. The CMP process is continuously performed until the hard layer 104a is fully exposed without a residue of the insulating layer 108. A remaining portion of the insulating layer 108 fills the trenches 105a, 105b becomes an insulating layer 108b, which is a STI structure 108b filled in the trenches 105a, 105b. Since the polysilicon layer 106a has much faster polishing rate, even though the hard layer 104a is overpolished, the dishing phenomenon still does not occur. Since the CMP process and other fabrication processes to accomplish the STI structure are well known by the one skilled in the art, the rest processes are not further described. Even though FIG. 3C does not completely show a final structure of the STI structure, it has shown the characteristics of the invention already. After the polysilicon layer 106a is removed by the CMP process, the silicon nitride layer 104a and the pad oxide layer 102a are also respectively removed.

EXAMPLE 2

Figure 4A:
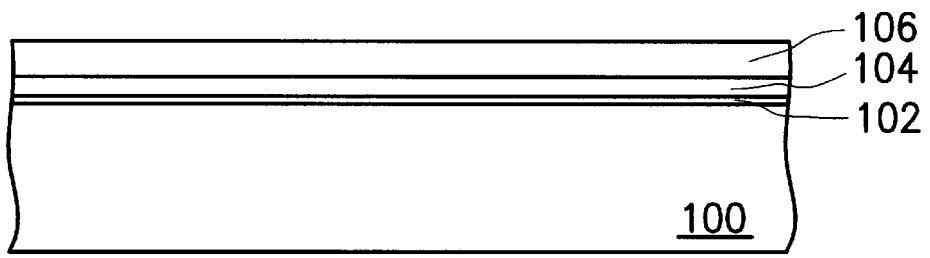
FIGS. 4A–4D are cross-sectional views of a portion of a substrate, schematically illustrating a fabrication process to form a STI structure, according to a second preferred embodiment of the invention.

An alternative method is similar to the first example but including an additional reverse patterning process to reduce the duration time of a CMP process. FIGS. 4A–4D are cross-sectional views of a portion of a substrate, schematically illustrating a fabrication process to form a STI structure, according to a second preferred embodiment of the invention. The like reference number represents the like object. In FIG. 4A, a pad oxide layer 102 is formed on a semiconductor substrate 100 by, for example, thermal oxidation. A mask layer 104 including, for example, silicon nitride is formed on the pad oxide layer 102 by, for example, chemical vapor deposition (CVD). The mask layer 104 preferably includes a thickness of about 500 Å–2000 Å. A polysilicon layer 106 is formed on the mask layer 104 with a thickness of about 500 Å–2000 Å. The polysilicon layer 106 is one of characteristics of the invention. The polysilicon layer 106 allows the conventional dishing issue and a residue issue of an insulating material on an STI structure to be avoided.

Figure 4B:
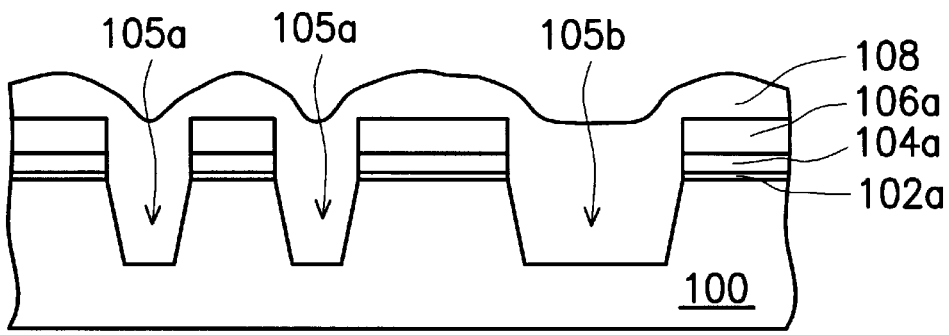

In FIG. 4B, a patterned photoresist layer (not shown) is formed on the polysilicon layer 106 so as to form several trenches, such as trenches 105a, 105b, in the substrate 100 by, for example, anisotropic etching. Several regions between the trenches 105a, 105b are called active regions. The dimension of each active region may different to each other. The width of the trench 150a is narrower than the width of the trench 105b. The pad oxide layer 102, the mask layer 104, and the polysilicon layer 106 of FIG. 3A respectively become a pad oxide layer 102a, a mask layer 104a, and a polysilicon layer 106a. An insulating layer 108 is formed over the substrate 100 so that the trenches 105a, 105b are also filled. The insulating layer 108 includes, for example, silicon oxide. Before the insulating layer 108 is formed, a liner oxide layer (not shown) is preferably formed on the trench inner surface by thermal oxidation.

Figure 4C:
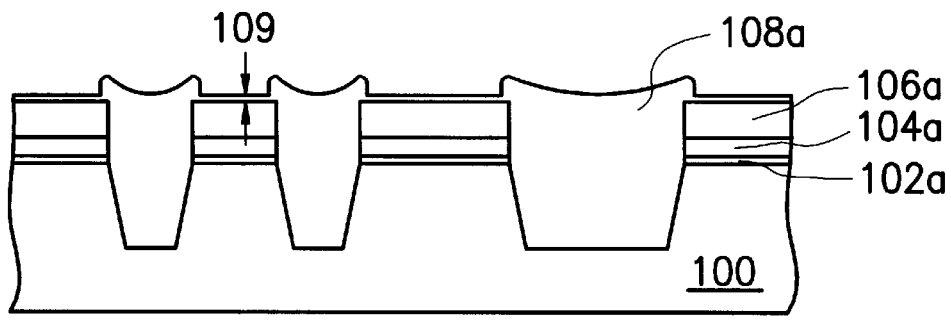

In FIG. 4C, a densification process is performed to densify the insulating layer. In order to reduce the operating duration time of a planarization process to form a STI structure, a reverse patterning process is performed to pre-remove a top portion of the insulating layer 108. Also referring to FIG. 4B, a reverse-tone photoresist layer (not shown) is formed on the insulating layer 108 above the trenches 105a, 105b. An etching process, such as an anisotropic etching process, is performed, using the polysilicon layer 106a as an etching stop point, so as to preremove the insulating layer 108 at a portion on the polysilicon layer 106a. The insulating layer 108 becomes an insulating layer 108a. The portion of the insulating layer 108a on the polysilicon layer 106a can be completely removed or partially removed. In the example of FIG. 4C, the second manner is, for example, shown. A remaining thin insulating layer 109 of the insulating layer 108a on the polysilicon layer 106a has a thickness of about 1000 Å–2000 Å. The reverse-tone photoresist layer is removed.

Figure 4D:
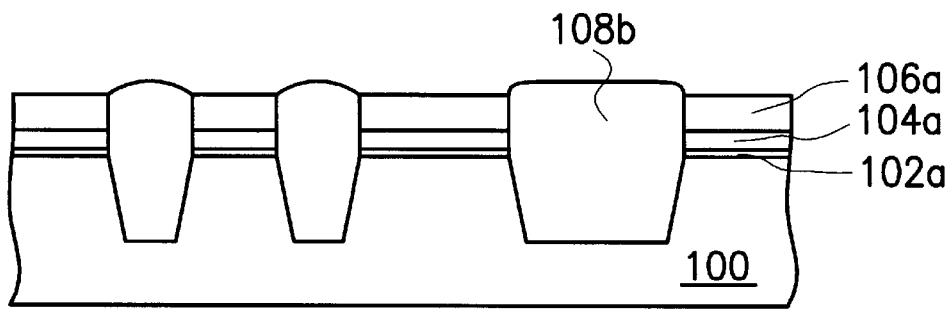

In FIG. 4C and FIG. 4D, a planarization process is performed to planarize the insulating layer 108a and the polysilicon layer 106a. The planarization process includes, for example, a CMP process. Since the polysilicon layer 106a has a polishing rate about 3–4 times faster than the insulating layer 108a, once the polysilicon layer 106a is exposed, it is polished by the CMP process with a faster rate. In this manner, there is no phenomenon occurring on the insulating layer 108a. Moreover, since the insulating layer 108a has been pre-removed to leave a remaining thin insulating layer 109 with much less thickness, the CMP process can fast expose the polysilicon layer 106a. The not only reduces the operation time but also is helpful to further prevent the dishing phenomenon from occurring because the portion of the insulating layer 108a at the trenches 105a, 105b is higher than the portion of the insulating layer 108a on the polysilicon layer 106a.

The CMP process is continuously performed until the hard layer 104a is fully exposed without a residue of the insulating layer 108. A remaining portion of the insulating layer 108a fills the trenches 105a, 105b to a STI structure 108b filled in the trenches 105a, 105b. Since the polysilicon layer 106a has much faster polishing rate, even though the hard layer 104a is over-polished, the dishing phenomenon still does not occur. Since the CMP process and other fabrication processes to accomplish the STI structure are well known by the one skilled in the art, the rest fabrication processes are not further described. Even though FIG. 4D does not completely show a final structure of the STI structure, it has shown the characteristics of the invention already. After the polysilicon layer 106a is removed by the CMP process, the silicon nitride layer 104a and the pad oxide layer 102a are also respectively removed.

In conclusion, for the above two examples, the invention uses the polysilicon layer 106 and further includes the reverse patterning process to prevent the dishing phenomenon from occurring. This is helpful for the subsequent fabrication of other device element, such as the gate structure. Moreover, the residue of the insulating layer 108b on the hard layer 104a is effectively avoided. This allows, for example, the hard layer 104a be easily removed from the substrate 100 without residue. The reverse patterning process can reduce the operation time of the CMP process. The production rate is accordingly increased, and a fabrication tolerance window for the STI fabrication is looser. The reverse patterning process also further prevent the dishing problem from occurring.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a shallow trench isolation (STI) structure on a semiconductor substrate, on which a pad oxide layer and a mask layer are sequentially formed, the method comprising:

forming a material layer on the mask layer;

patterning the material layer, the mask layer, and the pad oxide layer to form a trench in the semiconductor substrate, wherein an active region enclosed by the trench is also defined;

forming an insulating layer over the substrate so that the trench is also filled;

stripping the insulating layer at a portion above the active region, wherein the insulating layer leaves a smaller thickness on the material layer;

performing a planarization process to strip a portion of the insulating layer and the material layer so as to expose the mask layer, in which a remaining portion of the insulating layer forms the STI structure to fill the trench, wherein the material layer has a faster stripping rate than the stripping rate of the insulating layer.

2. The method of claim 1, wherein the material layer comprises polysilicon.

3. The method of claim 1, wherein the step of forming the material layer comprises CVD.

4. The method of claim 1, wherein the material layer comprises a thickness of about between 500 Å and 2000 Å.

5. The method of claim 1, wherein the insulating layer comprises silicon oxide.

6. The method of claim 1, wherein the mask layer comprises silicon nitride.

7. The method of claim 1, wherein the planarization process comprises a chemical mechanical polishing (CMP) process.

8. The method of claim 1, wherein the step of stripping the insulating layer at a portion above the active region further comprises:

forming a reverse-tone photoresist layer on the insulating layer to expose the insulating layer at the portion above the active region;

using the reverse-tone photoresist layer as a mask, etching the insulating layer; and stripping the reverse-tone photoresist layer.

9. The method of claim 8, wherein in the step of using the reverse-tone photoresist layer as a mask, etching the insulating layer, the insulating layer at the portion above the active region is stripped so that the polysilicon layer is exposed.

10. The method of claim 8, wherein in the step of using the reverse-tone photoresist layer as a mask, etching the insulating layer, the insulating layer at the portion above the active region is partially stripped.

11. The method of claim 10, wherein after the insulating layer at the portion above the active region is stripped, it comprises a thickness of about 1000 Å–2000 Å.

12. A method for fabricating a shallow trench isolation (STI) structure on a semiconductor substrate, on which a pad oxide layer and a mask layer are sequentially formed, the method comprising:

forming a material layer on the mask layer;

patterning the material layer, the mask layer, and the pad oxide layer to form a trench in the semiconductor substrate, wherein an active region enclosed by the trench is also defined;

forming an insulating layer over the substrate so that the trench is also filled;

performing a continuous planarization process to remove a portion of the insulating layer and the material layer so as to expose the mask layer, in which a remaining portion of the insulating layer forms the STI structure to fill the trench, wherein the material layer has a faster removal rate than the removal rate of the insulating layer.

* * * * *